United States Patent
Gallerano et al.

(10) Patent No.: US 11,239,229 B2
(45) Date of Patent: Feb. 1, 2022

(54) SELF-BIASED BIDIRECTIONAL ESD PROTECTION CIRCUIT

(71) Applicant: TEXAS INSTRUMENTS INCORPORATED, Dallas, TX (US)

(72) Inventors: Antonio Gallerano, San Jose, CA (US); Ann Margaret Concannon, Palo Alto, CA (US); Krishna Praveen Mysore Rajagopal, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 3 days.

(21) Appl. No.: 16/199,265

(22) Filed: Nov. 26, 2018

(65) Prior Publication Data
US 2019/0109127 A1    Apr. 11, 2019

Related U.S. Application Data

(62) Division of application No. 15/359,833, filed on Nov. 23, 2016, now Pat. No. 10,163,888.

(51) Int. Cl.
| | |
|---|---|
| *H01L 27/02* | (2006.01) |
| *H01L 29/06* | (2006.01) |
| *H01L 29/74* | (2006.01) |
| *H01L 29/747* | (2006.01) |

(52) U.S. Cl.
CPC ...... *H01L 27/0248* (2013.01); *H01L 27/0251* (2013.01); *H01L 27/0259* (2013.01); *H01L 29/0649* (2013.01); *H01L 29/747* (2013.01); *H01L 29/7436* (2013.01)

(58) Field of Classification Search
None
See application file for complete search history.

(56) References Cited

U.S. PATENT DOCUMENTS

| | | | |
|---|---|---|---|
| 8,497,526 B2 | 7/2013 | Vashchenko et al. | |
| 8,619,398 B1* | 12/2013 | Gallerano | H02H 3/22 |
| | | | 361/111 |
| 2007/0045656 A1 | 3/2007 | Chen | |
| 2009/0032838 A1 | 2/2009 | Tseng et al. | |
| 2012/0044606 A1* | 2/2012 | Jones | H03F 3/245 |
| | | | 361/56 |
| 2012/0091501 A1 | 4/2012 | Vashchenko et al. | |
| 2013/0141824 A1* | 6/2013 | Bourgeat | H01L 27/0274 |
| | | | 361/56 |
| 2014/0139109 A1* | 5/2014 | Morales | H05B 45/10 |
| | | | 315/121 |
| 2017/0366002 A1* | 12/2017 | Zhao | H01L 27/0262 |

* cited by examiner

*Primary Examiner* — Alexander G Ghyka
(74) *Attorney, Agent, or Firm* — Andrew R. Ralston; Charles A. Brill; Frank D. Cimino

(57) ABSTRACT

Disclosed examples provide an ESD protection circuit including a protection structure to selectively conduct current between a first terminal at a protected node and a second terminal at a reference node in response to the protected node voltage and a control voltage signal rising above a trigger voltage during an ESD event, and a bias circuit configured to bias a protection structure control terminal at a control voltage corresponding to a higher one of a first voltage of the first terminal and a second voltage of the second terminal to control the trigger voltage of the ESD protection structure to keep the ESD protection structure off during normal operation.

20 Claims, 8 Drawing Sheets

SELF-BIASED BIDIRECTIONAL ESD PROTECTION CIRCUIT

CROSS REFERENCE TO RELATED APPLICATIONS

Under 35 U.S.C. § 120, this divisional application claims the benefit of and priority to U.S. patent application Ser. No. 15/359,833, filed Nov. 23, 2016, the entirety of which is hereby incorporated herein by reference.

BACKGROUND

Electrostatic discharge (ESD) protection circuits use clamps triggered by ESD events safely discharge a protected pad or node. Dual direction or bidirectional clamp circuits provide protection for both positive and negative ESD voltages, while allowing the signal to swing positive and negative during normal operation. Dual direction ESD protection is adopted in many applications. For example, dual direction ESD protection is applicable to audio signal inputs, interfaces and level shifters. ESD clamps implemented as diacs or other thyristors in a CMOS process using deep n-wells or the like often have high threshold or trigger voltages, and are thus challenging for protecting low voltage circuitry. The trigger voltage of dual direction clamps with a p+/n-well junction breakdown scheme can be lowered by using polysilicon gates to improve the ESD clamp efficiency. When proper bias is provided to the gate, channel leakage can be prevented, thereby keeping the clamp circuit off during normal operation. For a PMOS gate structure in a clamp circuit using a p+/n-well junction breakdown to trigger ESD protection, the gate is biased above the PMOS threshold voltage during normal operation. However, biasing the clamp circuit gate at a positive supply rail can cause gate oxide integrity (GOI) problems during normal operation where negative voltages are applied to the protected pad. Alternatively, two separate unidirectional circuits may be used to protect each node with positive and negative signaling. However, such an approach will likely increase die size of an integrated circuit (IC).

SUMMARY

Disclosed examples provide a bidirectional ESD protection circuit including a protection structure or clamp component to selectively conduct current between a first terminal at a protected node and a second terminal at a reference node in response to the protected node voltage and a control voltage signal rising above a trigger voltage during an ESD event. A bias circuit biases a gate or other protection structure control terminal at a control voltage corresponding to a higher one of a first voltage of the first terminal and a second voltage of the second terminal to control the trigger voltage to keep the ESD protection structure off during normal operation. A multiplexer is used in certain embodiments to selectively apply the first or second voltage as the bias control signal, for example, using two PMOS transistors with cross-coupled gates and drains for self-biasing and using a self-selecting multiplexer.

DETAILED DESCRIPTION

Figure 1:
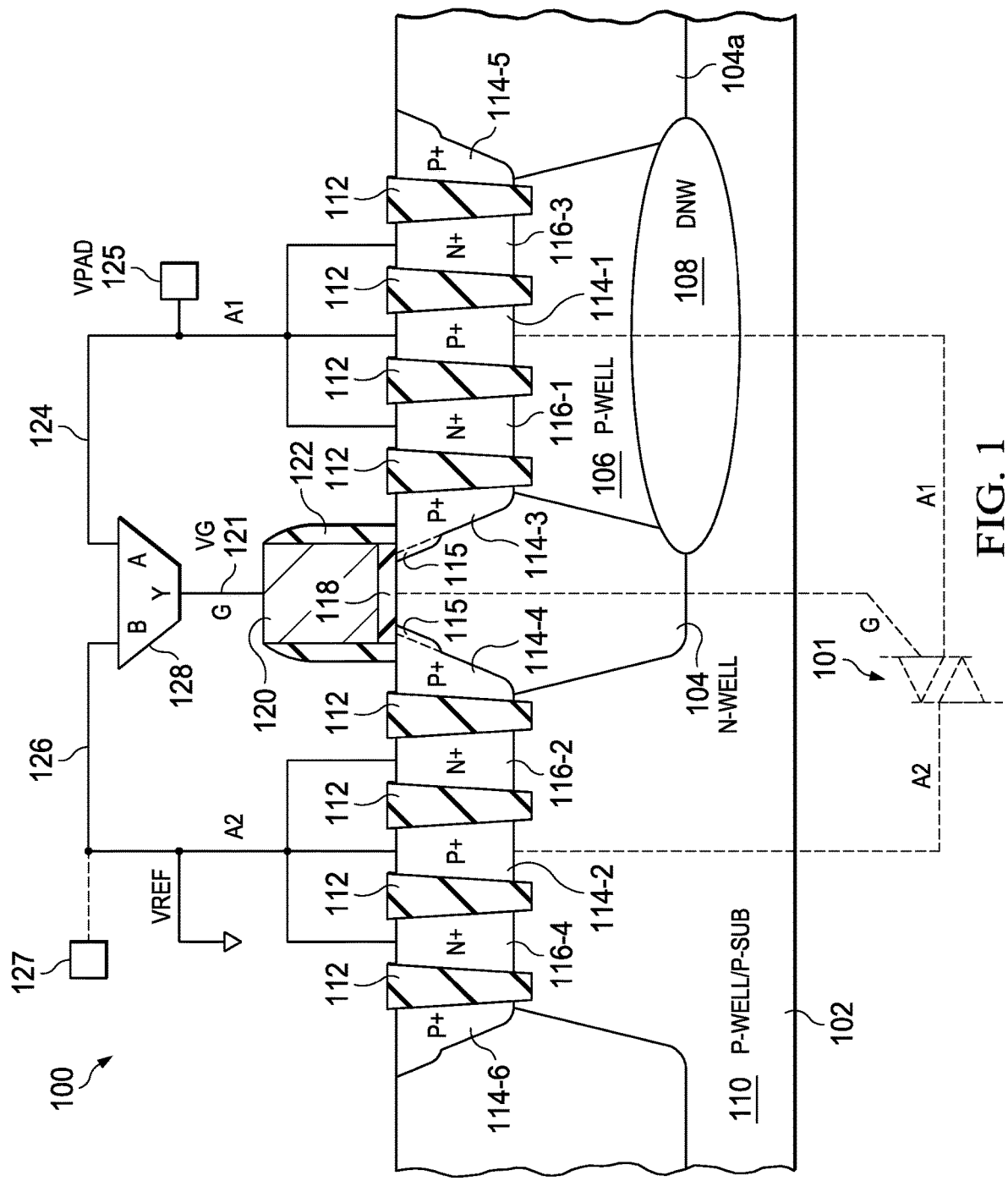
FIG. 1 is a partial sectional side elevation view schematically illustrating an ESD protection circuit including a self-biased bidirectional ESD protection circuit implementing a triac with a biasing circuit including a multiplexer.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Integrated circuits may be damaged by an ESD event during manufacturing, assembly, testing, or during normal operation in a given application. ESD events can be initiated by contact of an IC with a charged body (e.g., a human) that causes high voltages at one or more pins, pads or terminals of the IC. ESD events can damage host circuitry of an IC through thermal runaway and resultant junction shorting and/or dielectric breakdown causing gate-junction shorting in metal oxide semiconductor (MOS) circuits when the amount of charge exceeds the capability of the electrical conduction path through the IC. Disclosed ESD protection circuits can be provided in an IC to shunt ESD current between a protected pad or node and a reference node. The protected pad may be an I/O connection for conveying an audio signal or other time varying signal of positive or negative voltage to the IC during normal operation. False triggering of the ESD protection circuit due to the normal time varying signal applied to the protected pad is undesirable. Moreover, it is desired to provide a reasonably low trigger or threshold voltage to quickly turn on ESD protection structures to protect host circuits of an IC from excessive positive or negative ESD voltages.

As described herein, an ESD stress event can be understood as including an event on an I/O or power pad or other externally accessible node of a circuit that creates an elevated voltage (e.g., with respect to VSS or other voltage reference node), that is higher than a voltage which is normally supplied to the pad (e.g., higher than VDD or lower than a negative supply rail), or other ESD event that can stress or degrade a circuit component unless attenuated by ESD protection circuitry. For example, an ESD stress event may include events used in testing ESD immunity classification for the human body model (HBM Classes 0, 1A, 1B, 1C, 2, 3A and 3B), the charge device model (CDM Classes C1, C2, C3, C4, C5 and C6), and the machine model (MM Classes M1, M2, M3 and M4). The Human Body Model simulates ESD due to discharge from human beings, and the various levels of the HBM classifications are often used to describe an ESD stress event. CDM simulates the discharge of a charged device when it comes in contact with a conductive material, and MM represents a discharge from an object to the component. Many ICs include host circuitry that can be damaged by ESD events that deliver high voltages to one or more IC terminals (e.g., pins, pads).

Figure 6:
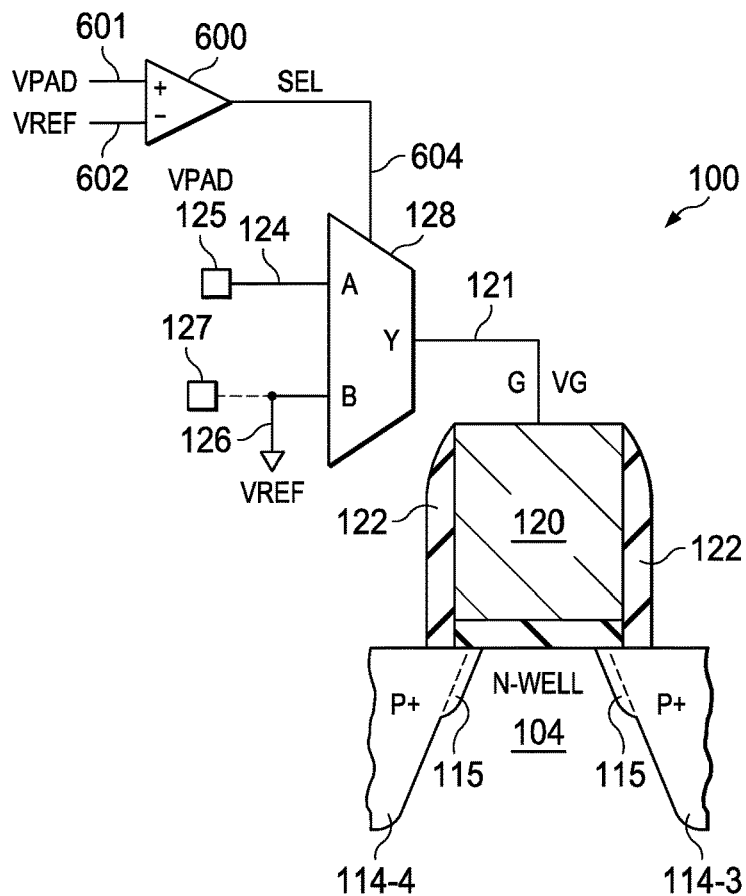
FIG. 6 is a partial schematic diagram of another self-biased bidirectional ESD protection circuit embodiment with a comparator providing a selection signal to a bias circuit multiplexer.
Figure 8:
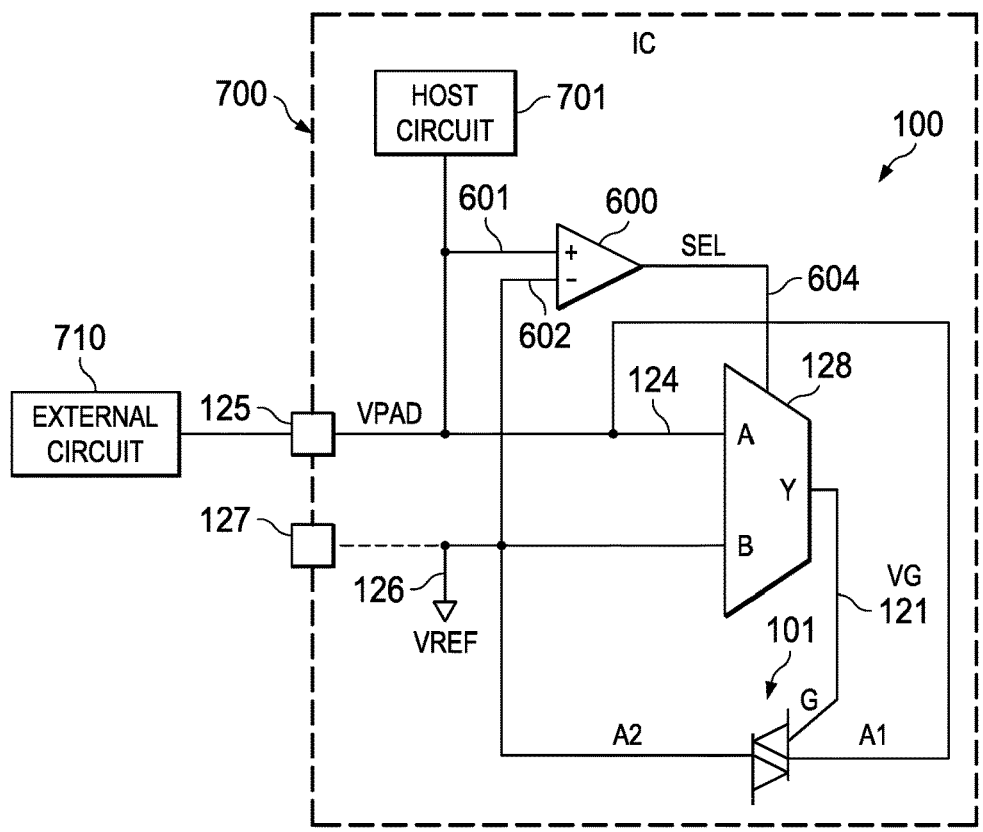
FIG. 8 is a schematic diagram of another integrated circuit embodiment including the self-biased bidirectional ESD protection circuit of FIG. 6 to protect a host circuit.

FIG. 1 shows an example ESD protection circuit 100 including a bidirectional ESD protection structure 101 and a multiplexer bias circuit 128 fabricated on and/or in a semiconductor substrate 102, such as silicon. The bias circuit 128 in certain embodiments selectively applies a voltage associated with first terminal A1 or a second terminal A2 of the protection structure 101 as a bias control signal or control voltage signal VG to a control terminal or gate structure G. In one example shown in FIG. 2, the bias circuit 128 includes two PMOS transistors P1 and P2 with cross-coupled gates and drains for self-biasing to implement a self-selecting multiplexer. In other examples, a multiplexer 128 output selection is controlled by a comparator circuit 600 as shown in FIGS. 6 and 8 below. The bias circuitry 128 in certain examples senses the voltage difference between the protected pad or node voltage and a ground or reference node, and produces the gate bias control voltage signal VG on a node 121 that tracks the higher of the two voltages at the terminals A1 and A2. By this operation with signal levels within an expected operating range on the protected node, the bias circuit 128 maintains the PMOS control gate structure and the protection structure 101 in an off state while mitigating channel leakage and without exposing the gate structure to oxide integrity issues. Disclosed bias circuits further avoid the excess space needed for approaches using two unidirectional clamps for each protected pad of an IC.

The ESD protection circuit 100 in certain embodiments includes a gate controlled triac 101 as shown in dashed lines in FIG. 1. The bidirectional ESD protection structure 101 in this example includes a first protection structure terminal A1 (e.g., a first anode) connected to a protected node 124, a second protection structure terminal A2 (e.g., a second anode) connected to a reference node 126, and a control terminal G. The protected node 124 in one example is an I/O line connected to a corresponding pin or pad 125 of an IC. In one example, the protected node 124 receives an audio or other AC voltage signal VPAD from an external circuit (not shown) having positive and negative voltages in an expected signal range (e.g., ±2.0 V). In one example, the reference node 126 is a ground node or other reference node of the IC having a reference voltage VREF. The reference node 126, moreover, is connected to an IC pad 127 for access to circuits external to the host IC in certain embodiments.

In operation, the ESD protection structure 101 is configured to selectively conduct current between the protected node 124 and the reference node 126 in response to the protected node voltage and control voltage signal VG at the control terminal G rising above a trigger voltage Vt1 outside the normal signal range (e.g., relative to the reference node voltage VREF) during an ESD event. Moreover, when VPAD is in the normal operating range (e.g., −2.0 V≤VPAD≤+2.0 V), the bias circuit 128 maintains the control voltage signal VG at approximately the highest of the node voltages VPAD and VREF. This ensures that the ESD protection structure 101 remains off or at least mitigates leakage during non-ESD event operation. Moreover, the voltage of a gate dielectric (e.g., gate oxide) 118 of the control gate structure will be limited to the difference between VPAD and VREF at all times. This allows use of a single low voltage CMOS gate fabrication process to construct transistors of a protected host circuit (not shown) as well as to construct the gate structure 118, 120, 122 of the ESD protection structure 101 without adverse GOI effects.

The ESD protection structure 101 in one example is a bidirectional triac formed by a p-well or other first p doped region 106 implanted with Boron or other p-type dopants in the substrate 102 alongside a first n-well 104 implanted with Phosphorus or other n-type dopants. In one example, the first p doped region 106 has a p-type dopant concentration in a range of 1E16-1E17 cm$^{-3}$, and the first n-well 104 has an n-type dopant concentration in a range of 1e16-1E17 cm$^{-3}$. A deep n-well (DNW) 108 is formed by implantation of n-type dopants in the substrate 102 beneath the first p doped region 106, for example, having a dopant concentration in a range of 1e18-1E19 cm$^{-3}$. The first p doped region 106 is adjacent at least a portion of the first n-well 104 and adjacent another n-well 104a to the right in FIG. 1. In this example, the first p doped region 106 is surrounded laterally and vertically by n doped regions 104, 104a and 108 (e.g., n-type dopant concentration in a range of 1e16-1E17 cm$^{-3}$). The protection structure 101 also includes a first n+ region 116-1 and a first p+ region 114-1 formed in the first p doped region 106 to define a first contact electrically connected to the first protection structure terminal A1. In one example, the illustrated p+ regions 114 have a p-type dopant concentration in a range of 1E19-1E20 cm$^{-3}$. In one example, the illustrated n+ regions 114 have an n-type dopant concentration in a range of 1E19-1E20 cm$^{-3}$. In certain examples, the illustrated ESD protection structure 101 and associated circuitry (e.g., including host circuitry and the biasing circuit 128) are fabricated in a single integrated circuit package, with the various schematically-illustrated interconnections being implemented in one or more metallization interconnection layers of the IC (not shown).

A second p doped region 110 is laterally spaced from the first p doped region 106 in the substrate 102. The second p doped region 110 in one example is formed as a p-well in the substrate 102. In another example, the second p doped region 110 is a portion of a p doped substrate 102. A second n+ region 116-2 and a second p+ region 114-2 are formed in the second p doped region 110 to define a second contact electrically connected to the second protection structure terminal A2. A first isolation structure 112 is laterally disposed between the first n+ region 116-1 and the third p+ region 114-3 and a second isolation structure 112 is laterally disposed between the first n+ region 116-1 and the first p+ region 114-1. The structure 101 further includes a third isolation structure 112 laterally disposed between the second n+ region 116-2 and the fourth p+ region 114-4, and a fourth isolation structure 112 laterally disposed between the second n+ region 116-2 and the second p+ region 114-2. Any suitable isolation structures 112 can be used, and can be fabricated according to any suitable techniques, such as field oxide structures, shallow trench isolation (STI) structures and processes, etc.

The first n-well 104 is laterally disposed between the first and second p doped regions 106 and 110 in the substrate 102, and the first and second contacts are isolated from one another by dual PN junctions. In one implementation, the second contact formed by the second n+ region 116-2 and the second p+ region 114-2 is connected to a reference voltage node 126. In this example, the first contact formed by the first n+ region 116-1 and the first p+ region 114-1 and the associated p-well (e.g., r-well) 106 are isolated from the reference node voltage VREF by means of the simply connected n-type region formed by the first n-well 104, the DNW 108 and the other n-well 104a. The first contact is connected in the IC to the pad 125 to receive the voltage signal VPAD, which can be positive or negative with respect to VREF. In certain examples, the reference node 126 is connected to a reference pin or pad 127 of the IC. The illustrated example further includes a third n+ region 116-3 laterally spaced from the p+ region 114-1 and connected to the first contact A1, and a fourth n+ region 116-4 laterally spaced outwardly from the p+ region 114-2 and connected to the second contact A2.

A PMOS type control gate structure in this example overlies an upper channel portion of the first n-well 104, and includes a gate oxide or other gate dielectric 118 disposed between the upper channel portion of the n-well 104 and an overlying metal or polysilicon gate 120. Oxide or other dielectric sidewalls 122 is formed on the lateral sides of the gate structure 120. The gate structure 120 is connected via the line 121 to an output of the multiplexer bias circuit 128 as schematically shown in FIG. 1. The gate structure 118, 120, 122 is situated above a channel portion of the n-well 104 to define a gate contact electrically connected to the control terminal G. The channel portion is laterally bounded by a third p+ region 114-3 laterally disposed between the first n+ region 116-1 and the first n-well 104 in the substrate 102, as well as a fourth p+ region 114-4 laterally disposed between the second n+ region 116-2 and the first n-well 104 in the substrate 102.

Figure 2:
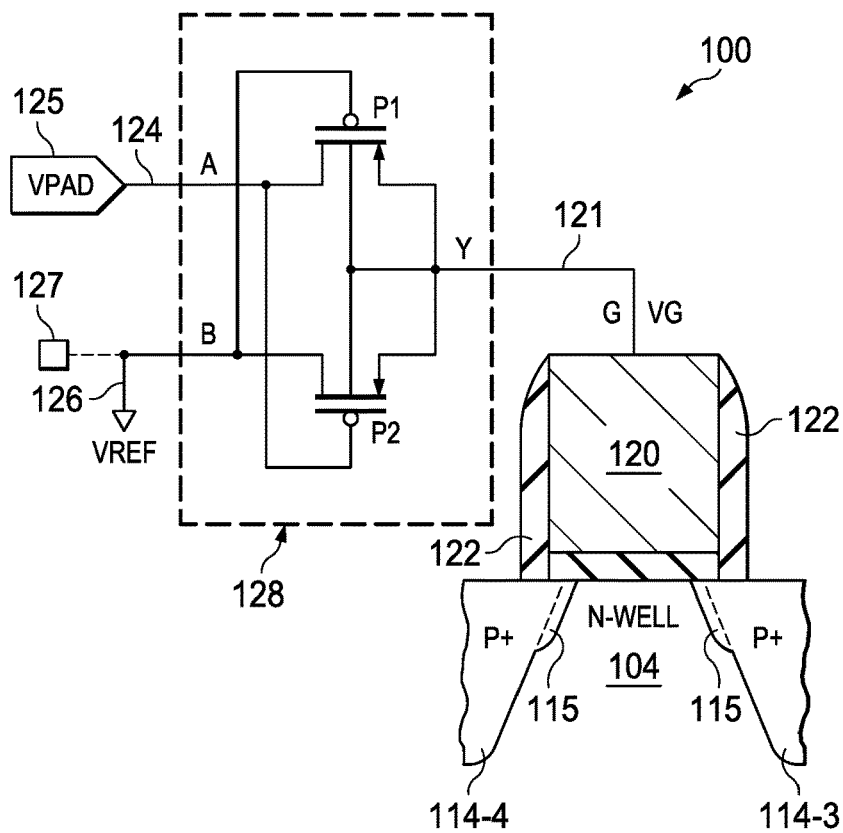
FIG. 2 is a schematic diagram showing a dual PMOS transistor implementation of the multiplexer in the circuit of FIG. 1.

Referring also to FIG. 2, the bias circuit 128 biases the control terminal G at a voltage VG corresponding to a higher one of VPAD of the terminal A1 and VREF of the terminal A2 to control a trigger voltage Vt1 of the ESD protection structure 101 to keep the ESD protection structure 101 off during normal operation. Application of a voltage VG to the gate control terminal G during an ESD event contributes to lower the trigger voltage Vt1 of the overall ESD protection structure 101 compared to a non-gated structure by increasing the electric field in the silicon under the gate edge and therefore lowering the breakdown voltage of the p+/n-well junction. During an ESD event with the PAD stressed positive with respect to reference, the clamp is triggered by the breakdown of the n-well 104 to the fourth p+ junction 114-4. During an ESD event of the opposite polarity the clamp is triggered by the breakdown of the n-well 104 to the third p+ junction 114-3. To help reduce the trigger voltage even further, the illustrated example also includes lightly doped p regions 115 individually located between the upper portion of the first n-well 104 and the third and fourth p+ regions 114-3 and 114-4, although not required for all embodiments. Where used, the lightly doped regions 115, doped with p-type dopants (e.g., boron) at a lower doping concentration than the p+ regions 114, have the effect of further increasing the electric field at the junction due to the shallow junction profile with small curvature radius, compared to an alternative graded junction with larger curvature radius. The gate biasing during an ESD event effectively reduces the threshold voltage to facilitate suitable triggering of the ESD protection structure 101 to respond to ESD events associated with a host IC. In addition, enhanced control of the gate voltage VG during normal operation prevents or mitigates inadvertent formation of an inversion channel and consequent leakage between the two p+ junctions 114-3 and 114-4 in normal operation when the protected node voltage VPAD transitions in an expected signal range of positive and negative voltages.

The bias circuit 128 example in FIG. 2 is a self-selecting multiplexer that includes a first input terminal A connected to the protected node 124, a second input terminal B connected to the reference node 126, and an output Y connected to the control terminal G. In operation, the multiplexer connects the output Y to the first input terminal A in a first mode when VPAD>VREF, and connects the output Y to the second input terminal B in a second mode when VPAD<VREF. The example of FIG. 2 is a compact design, which self-selects the output connection at the terminal Y through cross connection of drain and gate control terminals of first and second PMOS transistors P1 and P2. The first transistor P1 includes a first source connected to the control terminal G, a first drain connected to the protected node 124, and a first gate connected to the reference node 126. The second PMOS transistor P2 includes a second source connected to the control terminal G, a second drain connected to the reference node 126, and a second gate connected to the protected node 124. By this connection, the transistor P1 is turned on to connect VPAD to the output terminal Y when VPAD>VREF, and P2 is turned on to connect VREF to the output terminal Y when VPAD is negative relative to VREF. This ensures that the voltage across the thin gate oxide 118 of the gate structure is does not reach excessive levels during normal operation, thereby mitigating or avoiding GOI issues. This, in turn, facilitates fabrication of the gate structure 118, 120, 122 using a low voltage CMOS fabrication process that is also used to construct other low-voltage circuits in the host IC. Different CMOS, bipolar or other forms of multiplexer circuits 128 may be used to bias the gate structure and other embodiments.

Figure 3:
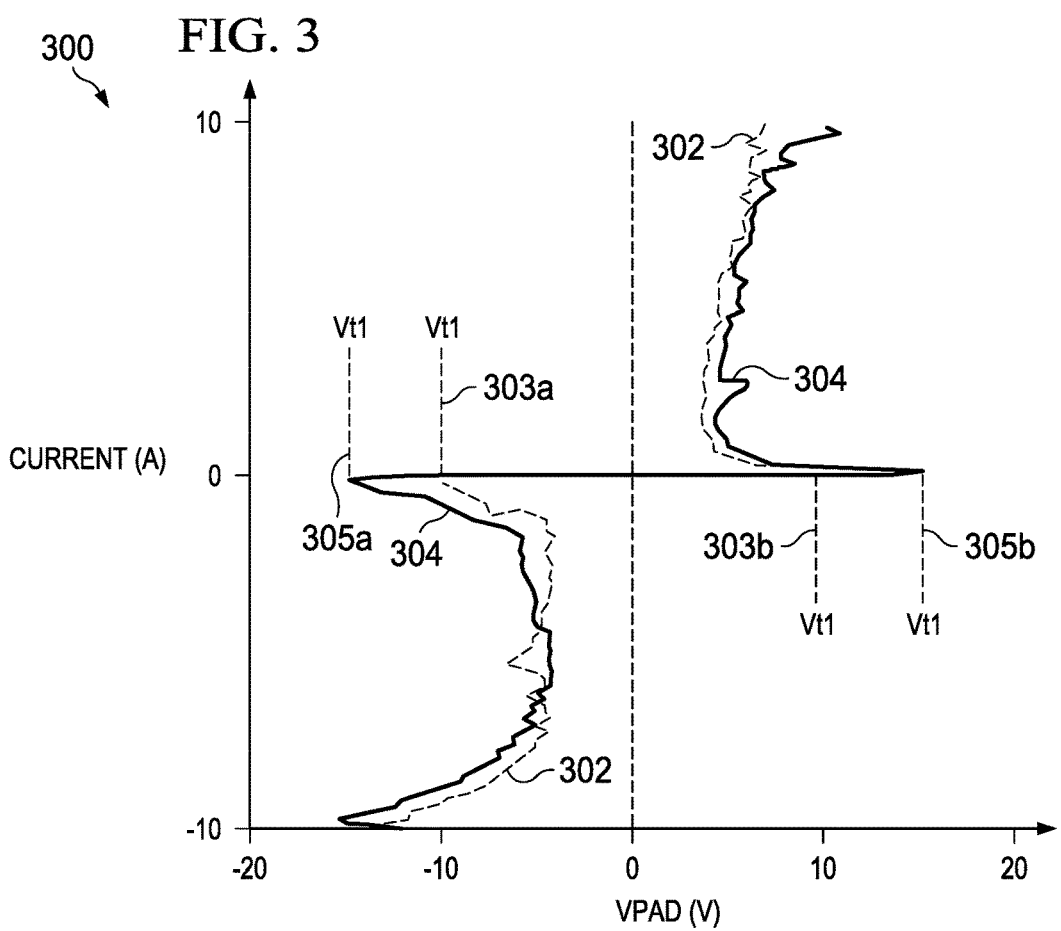
FIG. 3 is a graph of current as a function of protected node voltage showing trigger voltages for gated and non-gated bidirectional protection structures.

FIG. 3 provides a graph 300 illustrating a current curve 302 showing the current flowing through the bidirectional gated ESD protection structure 101 as a function of protected node voltage VPAD showing negative and positive trigger voltages 303a and 303b (Vt1) of approximately −10 V and +10 V, respectively. The graph 300 also shows a curve 304 with significantly higher trigger voltages 305a and 305b (e.g., approximately −/+15 V) for a non-gated bidirectional protection structure. As previously mentioned, the use of a gated structure 118, 120, 122 advantageously lowers the threshold trigger voltage of the protection circuit 101 to provide better response to ESD events in a host IC. In addition, the biasing circuitry 128 in illustrated examples facilitate lowering of the trigger voltages Vt1. The selective use of the lightly doped (e.g., LDD) regions 115 in FIGS. 1 and 2 can further reduce the threshold voltage of the PMOS state structure and thereby reduce the ESD protection structure trigger voltage Vt1 for both positive and negative protected node voltages VPAD. In one example, the lightly doped regions 115 have a p-type dopant concentration in the range of 1e16-1E17 $cm^{-3}$.

Figure 4:
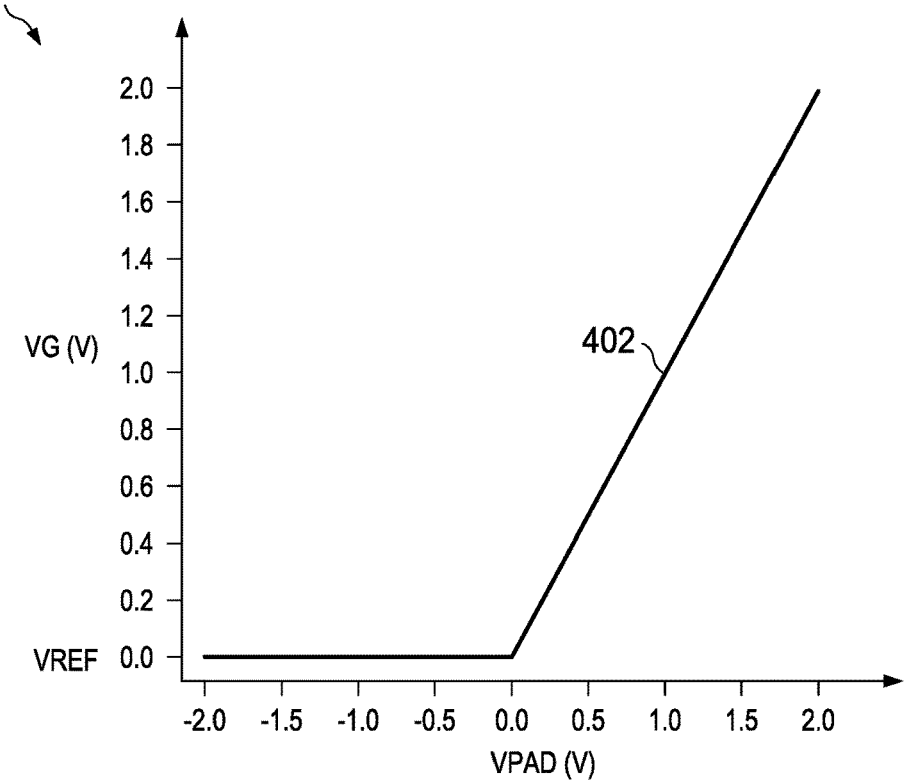
FIG. 4 is a graph of gate control voltage as a function of protected node voltage for the bidirectional ESD protection circuit of FIG. 1.
Figure 5:
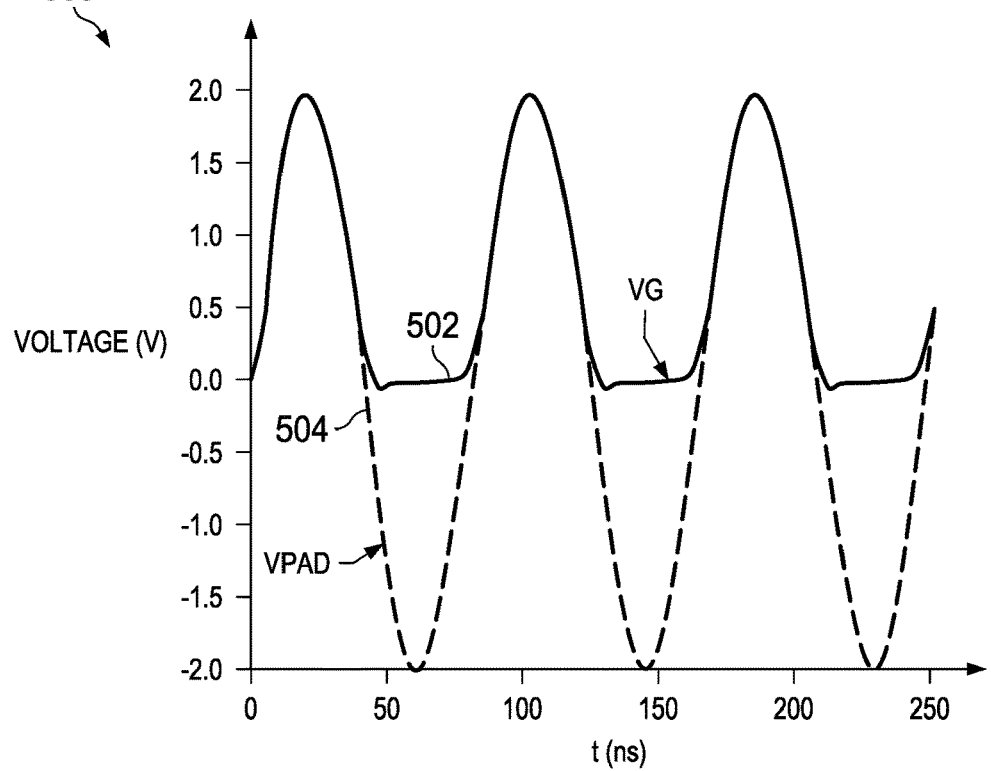
FIG. 5 is a graph of protected node voltage and a gate control voltage as a function of time during normal operation with a time-varying protected node voltage of lower magnitude than the ESD protection structure trigger voltage.

FIG. 4 provides a graph 400 with a curve 402 illustrating the gate control voltage VG as a function of the protected node voltage VPAD for one example of the bidirectional ESD protection circuit 100 of FIGS. 1 and 2. In addition, FIG. 5 provides a graph 500 illustrating a gate control voltage curve 502 (VG) and a protected node voltage curve 504 (VPAD) as a function of time during normal operation with an example sinusoidal VPAD signal transitioning between positive and negative values in an expected signal range (e.g., ±2 V) below the ESD protection structure trigger voltage. As seen in the curves 402 and 502, the bias circuit 128 provides a gate control voltage signal VG generally equal to positive values of the protected node voltage VPAD. However, the bias circuit 128 clamps the control voltage VG at the reference node voltage value VREF (e.g., 0.0 V in this example) for negative values of VPAD.

FIG. 6 illustrates another self-biased bidirectional ESD protection circuit embodiment 100, including a multiplexer bias circuit 128 as described above, along with a comparator 600 that provides a selection signal SEL to a selection input of the bias circuit multiplexer 128. In this example, the comparator 600 includes a first (+) input 601 connected to the protected node 124 to receive the protected node voltage signal VPAD, and a second input 602 connected to the reference node 126 to receive the reference node voltage signal VREF. An output 604 of the comparator 600 provides the selection signal SEL at a first level to cause the multiplexer 128 to connect the first input A to the multiplexer output Y when VPAD>VREF. When VPAD<VREF, the output 604 of the comparator 600 provides the selection signal SEL at a different second-level to cause the multiplexer 128 to connect the second multiplexer and put B to the multiplexer output Y. As mentioned above, the self-selecting multiplexer 128 in FIG. 2 uses a cross-connected pair of PMOS transistors P1 and P2, and thus conserves IC region and power consumption compared with the embodiment in FIG. 6.

Figure 7:
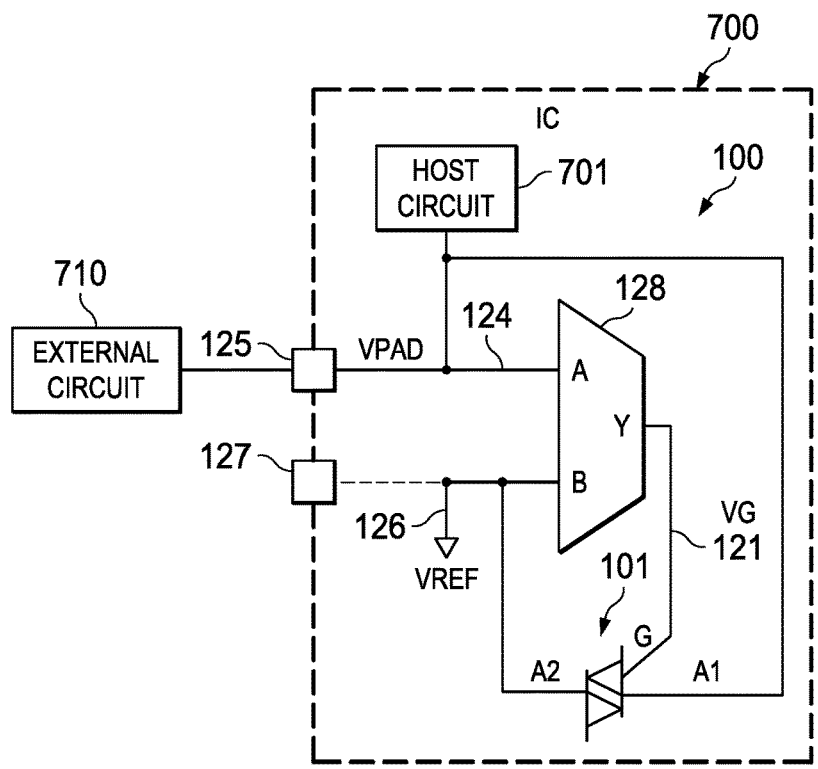
FIG. 7 is a schematic diagram of an integrated circuit including the self-biased bidirectional ESD protection circuit of FIG. 1 to protect a host circuit connected to a protected node.

FIG. 7 schematically illustrates an integrated circuit (IC) 700 including the self-biased bidirectional ESD protection circuit 100 of FIGS. 1 and 2 to protect a host circuit 701 connected to the protected node 124. In this example, an external circuit 710 provides the VPAD signal during normal operation for use by the host circuit 701, and the protection circuit 100 provides ESD protection to the protected node 124 and the associated IC pad 125. As seen in FIG. 7, the reference voltage node 126 can also be externally accessible via a corresponding IC pad 127, although not a requirement of all embodiments. During an ESD event, the ESD protection structure 101 selectively conduct current from the protected node 124 to the reference node 126 in order to direct the flow of ESD current away from the host circuit 701 and to prevent excessive voltage rise on the protected node 124. FIG. 8 shows another possible embodiment of an IC 700 including the self-biased bidirectional ESD protection circuit 100 of FIG. 6 with the above-described comparator 600 to protect the host circuit 110.

Figure 9:
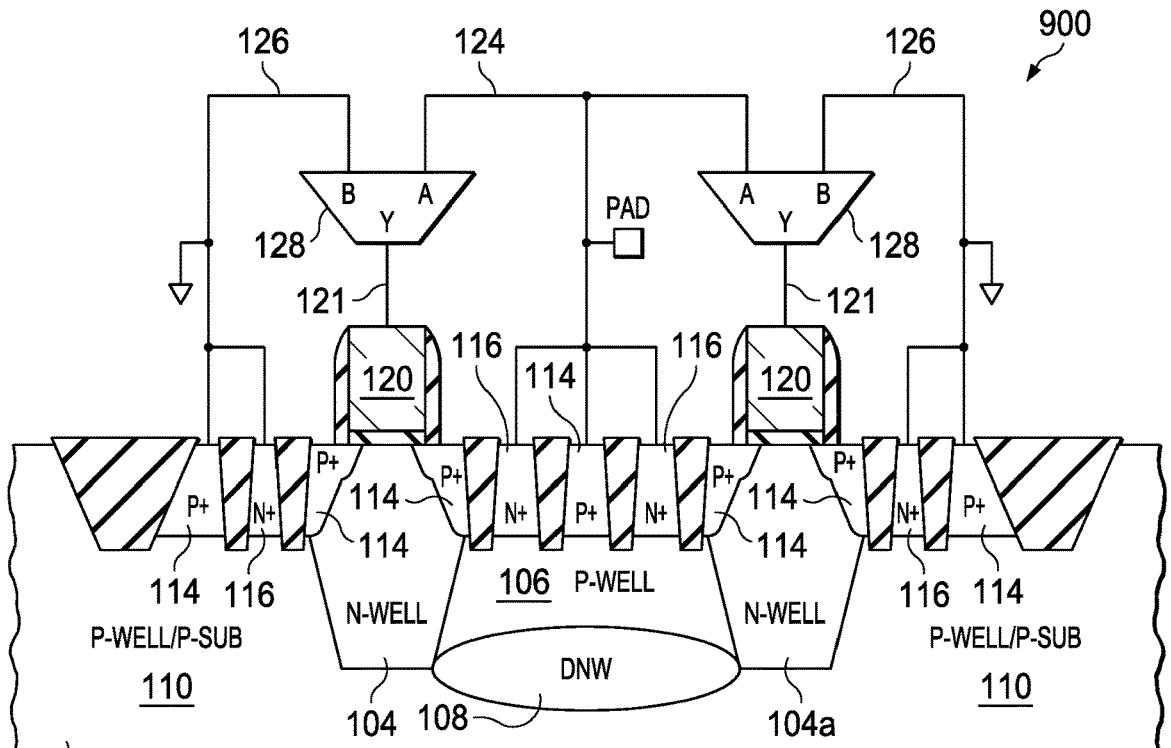
FIG. 9 is a partial sectional side elevation view schematically illustrating a symmetrical 2-finger ESD protection circuit including a self-biased bidirectional ESD protection circuit implementing a triac with a biasing circuit.
Figure 10:
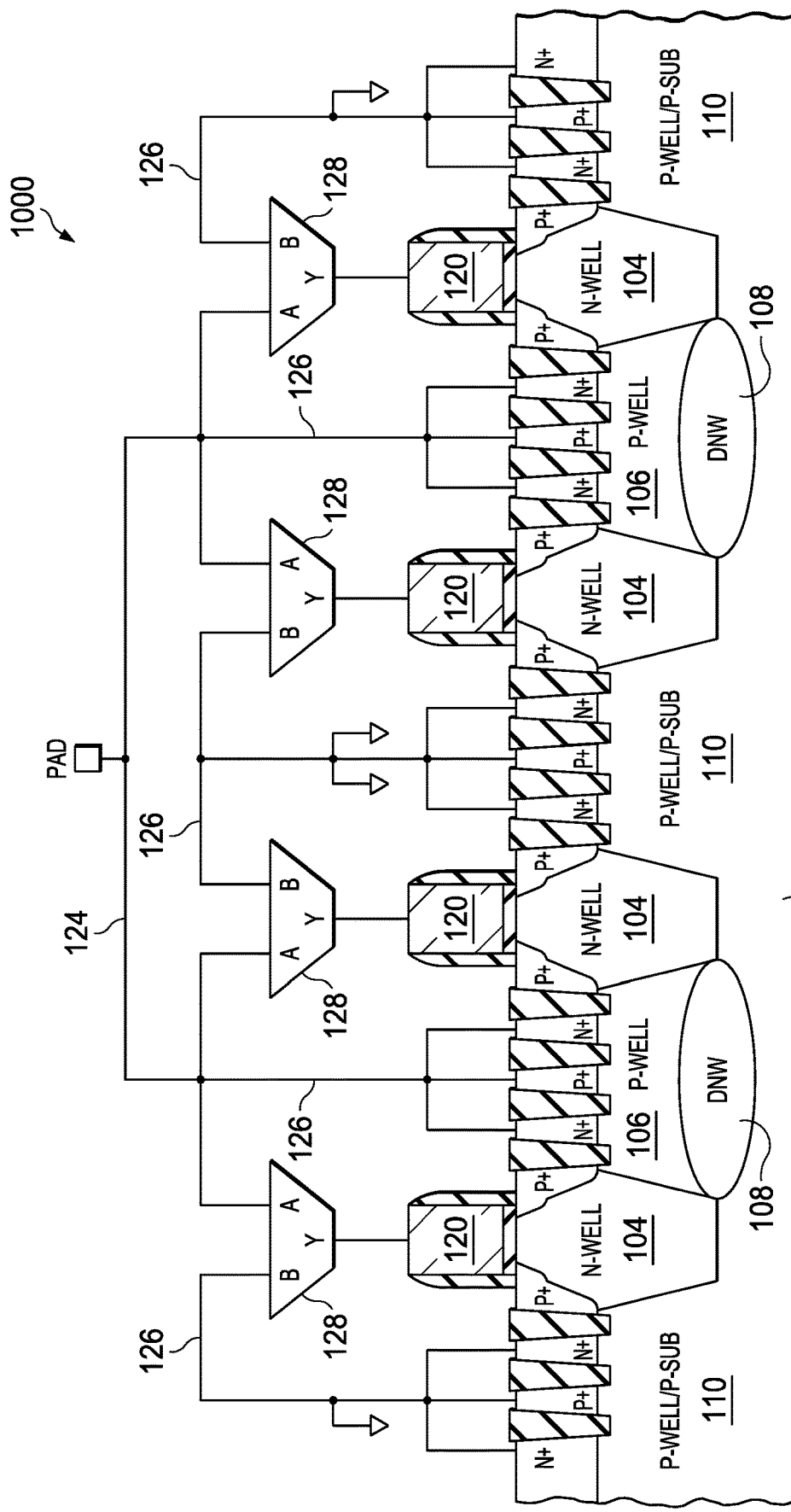
FIG. 10 is a partial sectional side elevation view schematically illustrating a symmetrical 4-finger ESD protection circuit including a self-biased bidirectional ESD protection circuit implementing a triac with a biasing circuit.
Figure 11:
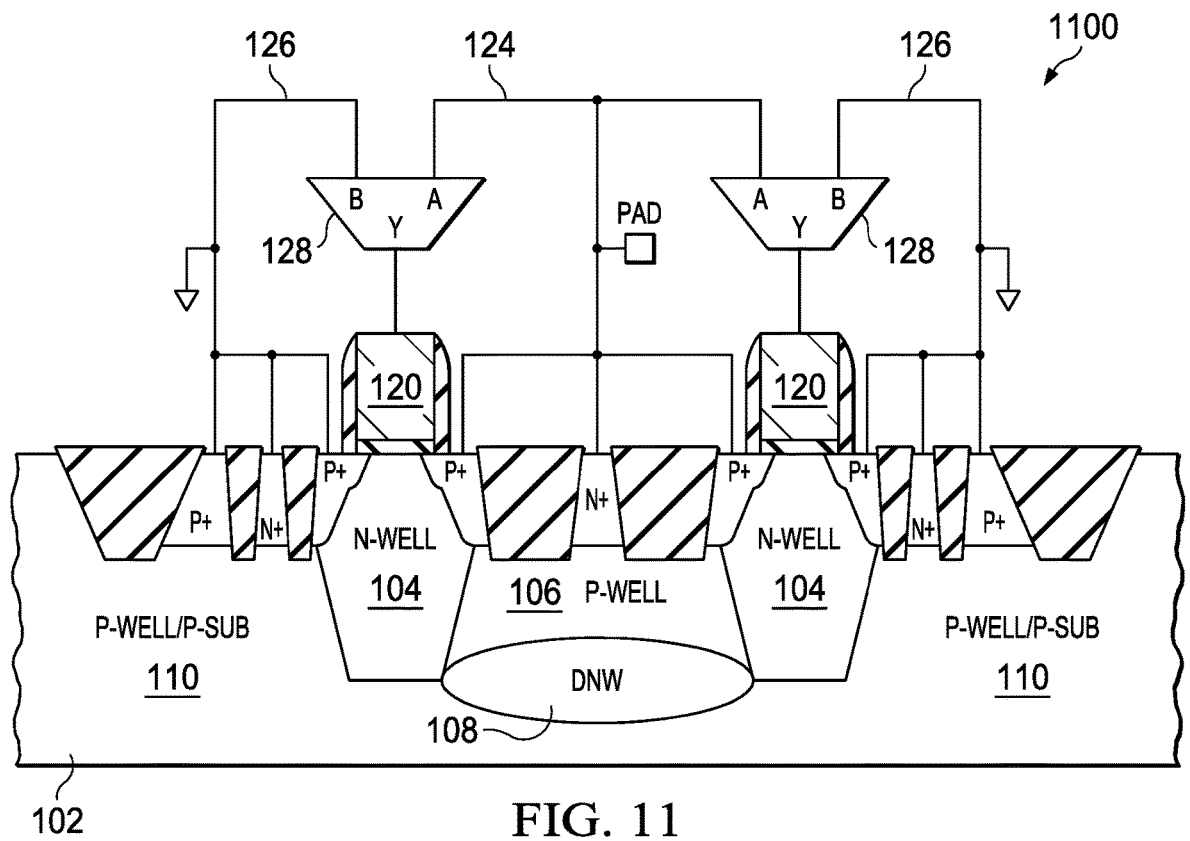
FIG. 11 is a partial sectional side elevation view schematically illustrating an alternate symmetrical 2-finger ESD protection circuit including a self-biased bidirectional ESD protection circuit implementing a triac with a biasing circuit.

FIG. 9 shows a symmetrical 2-finger ESD protection circuit configuration 900 that includes a self-biased bidirectional ESD protection circuit as described above to implement a triac. In the example of FIG. 9, a central symmetry is provided around the pad connection above the p-well 106 above the deep n-well 108, with first and second gate structures 120 above corresponding lowercase n-wells 104. The laterally symmetrical implementation of FIG. 9 advantageously provides symmetrical conduction paths for positive and negative ESD events at the pad relative to ground. FIG. 10 shows another symmetrical self-biased bidirectional ESD protection circuit example 1000 including 4 fingers formed by corresponding gate structures 120 above corresponding p-wells 106 with interleaved gate structure fingers. The symmetrical concept can be extended to any number of fingers, and the laterally outlying final ground connections or contacts can be constructed along an outer shallow trench isolation or field oxide structure in certain implementations (not shown in FIG. 10). As shown in FIG. 9, moreover, the final ground or reference contact structures on either lateral side of the circuit 1000 can be terminated by an STI or field oxide structure alongside final p+ region (e.g., the final n+ region can be omitted). FIG. 11 shows an alternate symmetrical 2-finger ESD protection circuit 1100 including a self-biased bidirectional ESD protection circuit implementing a triac with a biasing circuit. In this case, the pad contact only includes a single n+ region separated by corresponding STI structures from the laterally outward p+ regions.

Figure 12:
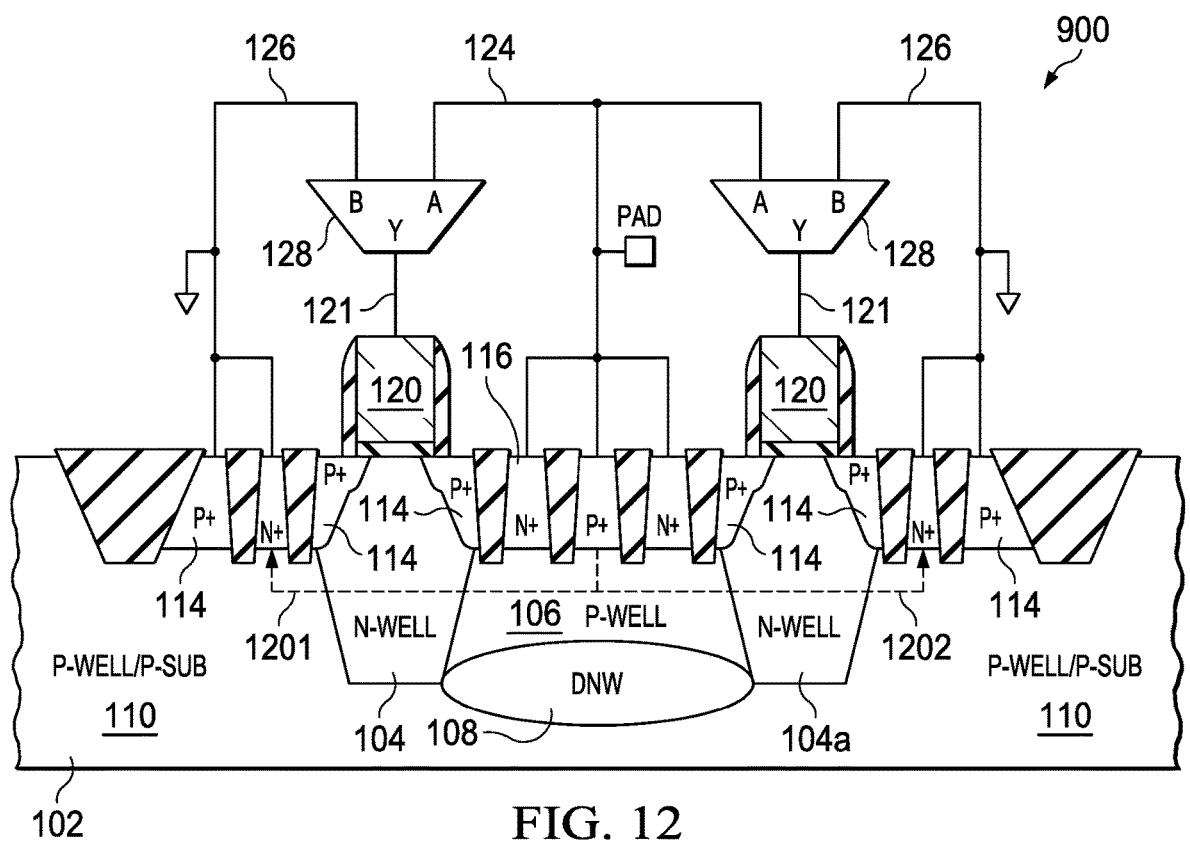
FIG. 12 is a partial sectional side elevation view schematically illustrating positive ESD stress discharge current paths from pad to ground in the symmetrical 2-finger ESD protection circuit of FIG. 9.
Figure 13:
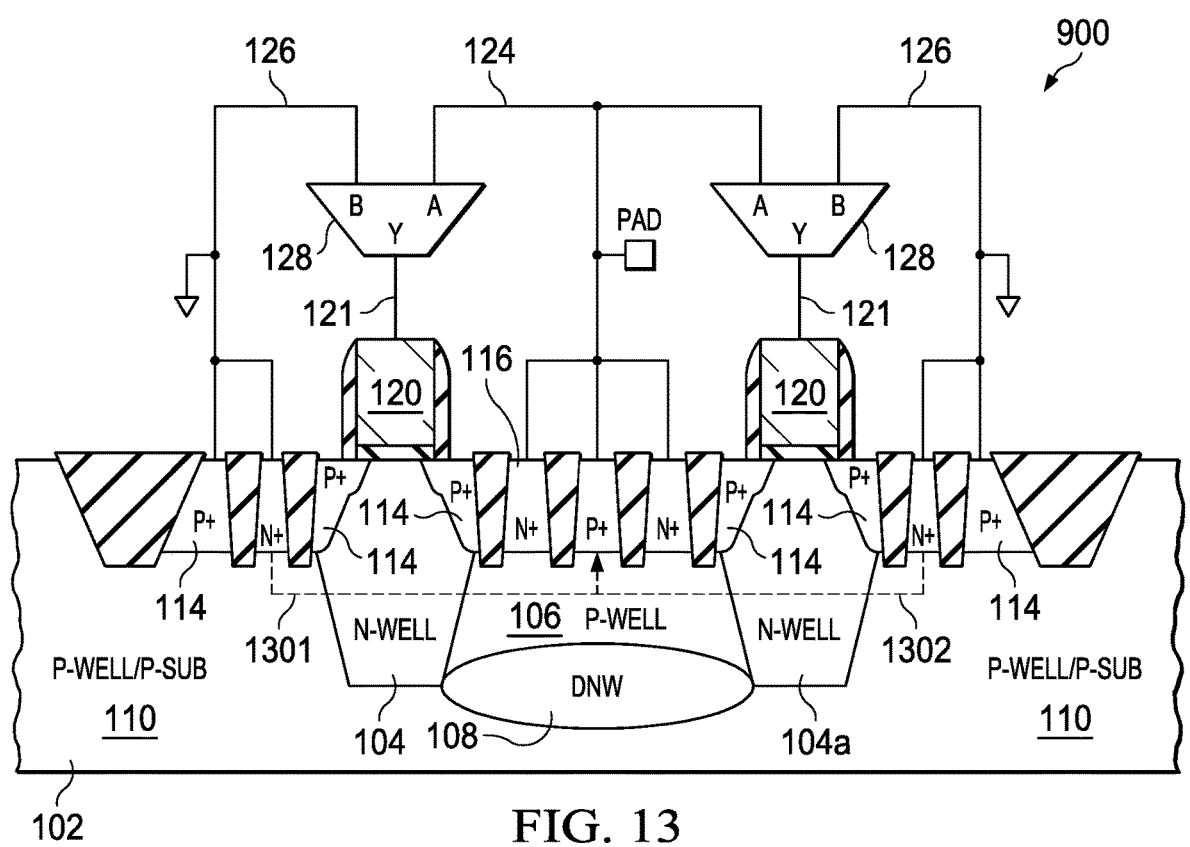
FIG. 13 is a partial sectional side elevation view schematically illustrating negative ESD stress discharge current paths from ground to pad in the symmetrical 2-finger ESD protection circuit of FIG. 9.

FIGS. 12 and 13 respectively illustrate positive and negative ESD stress discharge current paths in the 2-finger ESD protection circuit 900 of FIG. 9. As shown in FIG. 12, a positive ESD event is discharged by current flow outward from the central from the pad node 124 to the ground or reference node 126 along symmetrical current paths 1201 and 1202. For negative ESD events (e.g., where VPAD<VREF), negative ESD stress discharge current flows inward along the illustrated paths 1301 and 1302 in FIG. 13 from the reference node 126 to the pad node 124 in the example 2-finger ESD protection circuit 900.

The present disclosure thus provides improved bidirectional ESD protection circuitry 100, which can implement self-biased triac devices 100 for ESD protection or other uses. The described triac devices 100 include first and second terminals A1 and A2 along with a control terminal G, as well as a bias circuit 128 operative one powered to bias the control terminal G at a control voltage VG to control a trigger voltage Vt1 of the triac 100. As previously mentioned, the example of FIG. 2 advantageously employs a compact self-selecting bias circuit 128 that includes a first PMOS transistor P1 with a first source connected to the control terminal G, a first drain connected to the first terminal A1, and a first gate connected to the second terminal A2. The bias circuit 128 of the triac design 100 shown in FIG. 2 also includes a second PMOS transistor P2 with a second source connected to the control terminal G, a second drain connected to the second terminal A2, and a second gate connected to the first terminal A1.

The above examples are merely illustrative of several possible embodiments of various aspects of the present disclosure, wherein equivalent alterations and/or modifications will occur to others skilled in the art upon reading and understanding this specification and the annexed drawings.

Modifications are possible in the described embodiments, and other embodiments are possible, within the scope of the claims.

What is claimed is:

1. An integrated circuit (IC), comprising:
a pad connected to a protected node;
a host circuit connected to the pad to receive a voltage signal from an external circuit;
a bidirectional ESD protection structure connected between the protected node and a reference node; and
a bias circuit to bias a control terminal of the bidirectional ESD structure at a voltage corresponding to a higher one of a first voltage of the protected node and a second voltage of the reference node.

2. The IC of claim 1, wherein the bidirectional ESD protection structure includes:
a first protection structure terminal connected to the protected node;
a second protection structure terminal connected to the reference node;
a first p doped region in a substrate;
a first n+region and a first p+region formed in the first p doped region to define a first contact electrically connected to the first protection structure terminal;
a second p doped region laterally spaced from the first p doped region in the substrate;
a second n+region and a second p+region formed in the second p doped region to define a second contact electrically connected to the second protection structure terminal;
a first n-well laterally disposed between the first and second p doped regions in the substrate;
a deep n-well formed in the substrate beneath the first p doped region, and adjacent at least a portion of the first n-well to isolate the first and second contracts;
a third p+region laterally disposed between the first n+region and the first n-well in the substrate;
a fourth p+region laterally disposed between the second n+region and the first n-well in the substrate; and
a gate structure formed above a channel region of the first n-well between the third and fourth p+regions to define a gate contact electrically connected to the control terminal.

3. The IC of claim 2, further comprising a first isolation structure laterally disposed between the first n+region and the third p+region; a second isolation structure laterally disposed between the first n+region and the first p+region; a third isolation structure laterally disposed between the second n+region and the fourth p+region; and a fourth isolation structure laterally disposed between the second n+region and the second p+region.

4. The IC of claim 2, further comprising a lightly doped p region between an upper portion of the first n-well and one of the third and fourth p+regions.

5. The IC of claim 1, wherein the bias circuit comprises a multiplexer that includes a first input terminal connected to the protected node, a second input terminal connected to the reference node, and an output connected to the control terminal, the multiplexer being configured to connect the output to the first input terminal in a first mode when the first voltage is greater than the second voltage, and to connect the output to the second input terminal in a second mode when the first voltage is less than the second voltage.

6. The IC of claim 5, wherein the multiplexer includes:
a first PMOS transistor, including a first source connected to the control terminal, a first drain connected to the protected node, and a first gate connected to the reference node; and
a second PMOS transistor, including a second source connected to the control terminal, a second drain connected to the reference node, and a second gate connected to the protected node.

7. An integrated circuit (IC), comprising:
a protected node;
a protected circuit connected to the protected node;
a bidirectional ESD protection structure connected between the protected node and a reference node; and
a control circuit configured to provide a control signal to a control terminal of the bidirectional ESD protection structure at a voltage corresponding to a higher one of a first voltage of the protected node and a second voltage of the reference node.

8. The IC of claim 7, wherein the control circuit includes a comparator configured to receive the first and second voltages and to provide a selector signal to a multiplexor configured to select between the first voltage and the second voltage for the control signal.

9. The IC of claim 7, wherein the control circuit includes a comparator configured to receive the first and second voltages and to provide a selector signal to a multiplexor configured to select between the first voltage and the second voltage for the control signal.

10. The IC of claim 7, wherein the ESD protection structure comprises a triac.

11. The IC of claim 7, wherein the multiplexer includes:
a first PMOS transistor, including a first source connected to the control terminal, a first drain connected to the protected node, and a first gate connected to the reference node; and
a second PMOS transistor, including a second source connected to the control terminal, a second drain connected to the reference node, and a second gate connected to the protected node.

12. The IC of claim 7, wherein the control terminal includes a MOS control gate of the ESD protection structure, and the multiplexer includes:
a first PMOS transistor having a first source, a first drain and a first gate; and
a second PMOS transistor having a second source, a second drain and a second gate, wherein
the first source is connected directly to the MOS control gate, the first drain is connected to the protected node, and the first gate is connected to the reference node, and
the second source is connected directly to the MOS control gate, the second drain is connected to the control node, and the second gate is connected to the protected node.

13. An integrated circuit (IC), comprising:
a protected circuit connected to a protected node;
a bidirectional ESD protection structure having a control terminal and being connected between the protected node and a reference node; and
a first MOS transistor, including a first source connected directly to the control terminal, a first drain connected to the protected node, and a first gate connected to the reference node, and
a second MOS transistor, including a second source connected directly to the control terminal, a second drain connected to the reference node, and a second gate connected to the protected node.

14. The IC of claim 13, wherein the bidirectional ESD protection structure comprises a triac having a first anode connected to the protected node, a second anode connected to the reference node, and the control terminal includes a gate of the triac.

15. The IC of claim 13, wherein the bidirectional ESD protection structure comprises a comparator configured to provide a control signal to the bidirectional ESD protection structure in response to a voltage present on the protected node.

16. An integrated circuit (IC), comprising:
a pad connected to a protected node;
a host circuit connected to the pad to receive a voltage signal from an external circuit;
a bidirectional ESD protection structure connected between the protected node and a reference node, the bidirectional ESD protection structure including:
a first protection structure terminal connected to the protected node;
a second protection structure terminal connected to the reference node;
a first p doped region in a substrate;
a first n+region and a first p+region formed in the first p doped region to define a first contact electrically connected to the first protection structure terminal;
a second p doped region laterally spaced from the first p doped region in the substrate;
a second n+region and a second p+region formed in the second p doped region to define a second contact electrically connected to the second protection structure terminal;
a first n-well laterally disposed between the first and second p doped regions in the substrate;
a deep n-well formed in the substrate beneath the first p doped region, and adjacent at least a portion of the first n-well to isolate the first and second contracts;
a third p+region laterally disposed between the first n+region and the first n-well in the substrate;
a fourth p+region laterally disposed between the second n+region and the first n-well in the substrate; and
a gate structure formed above a channel region of the first n-well between the third and fourth p+regions to define a gate contact electrically connected to the control terminal; and
a bias circuit to bias a control terminal of the bidirectional ESD structure at a voltage corresponding to a higher one of a first voltage of the protected node and a second voltage of the reference node.

17. The IC of claim 16, further comprising a first isolation structure laterally disposed between the first n+region and the third p+region; a second isolation structure laterally disposed between the first n+region and the first p+region; a third isolation structure laterally disposed between the second n+region and the fourth p+region; and a fourth isolation structure laterally disposed between the second n+region and the second p+region.

18. The IC of claim 16, further comprising a lightly doped p region between an upper portion of the first n-well and one of the third and fourth p+regions.

19. The IC of claim 16, wherein the bias circuit comprises a multiplexer that includes a first input terminal connected to the protected node, a second input terminal connected to the reference node, and an output connected to the control terminal, the multiplexer being configured to connect the output to the first input terminal in a first mode when the first voltage is greater than the second voltage, and to connect the output to the second input terminal in a second mode when the first voltage is less than the second voltage.

20. The IC of claim 19, wherein the multiplexer includes:
a first PMOS transistor, including a first source connected to the control terminal, a first drain connected to the protected node, and a first gate connected to the reference node; and
a second PMOS transistor, including a second source connected to the control terminal, a second drain connected to the reference node, and a second gate connected to the protected node.

* * * * *